United States Patent [19]

Young et al.

[11] 4,205,119
[45] May 27, 1980

[54] WRAPPED TANTALUM DIFFUSION BARRIER

[75] Inventors: Morris S. Young, Murray Hill, N.J.; David C. Larbalestier, Madison, Wis.

[73] Assignee: Airco, Inc., Montvale, N.J.

[21] Appl. No.: 933,302

[22] Filed: Aug. 14, 1978

Related U.S. Application Data

[63] Continuation-in-part of Ser. No. 920,616, Jun. 29, 1978, abandoned.

[51] Int. Cl.² .................. B21C 37/12; H01L 39/06
[52] U.S. Cl. .................. 428/614; 29/599; 174/15 S; 174/126 S; 174/128 S; 428/930
[58] Field of Search .............. 428/614, 612, 674, 930, 428/651, 672, 674; 148/31.5; 174/15 S, 126 S, 128 S; 75/243; 29/423, 599

[56] References Cited

U.S. PATENT DOCUMENTS

| | | | |
|---|---|---|---|
| 3,296,684 | 1/1967 | Allen et al. | 428/930 |
| 3,540,114 | 11/1970 | Roberts et al. | 29/599 |
| 3,570,118 | 3/1971 | Reynolds et al. | 428/930 |
| 3,579,800 | 5/1971 | Packord | 29/423 |
| 3,728,165 | 4/1973 | Howlett | 148/11.5 |
| 3,813,764 | 6/1974 | Tonalia et al. | 174/126 S |
| 3,905,839 | 9/1975 | Hashimoto | 148/11.5 |
| 3,958,327 | 5/1976 | Marancik et al. | 29/599 |
| 3,996,661 | 12/1976 | Ziegler et al. | 29/599 |

FOREIGN PATENT DOCUMENTS 1394724  5/1975  United Kingdom.
1499507  2/1978  United Kingdom.

*Primary Examiner*—L. Dewayne Rutledge
*Assistant Examiner*—Michael L. Lewis
*Attorney, Agent, or Firm*—Edmund W. Bopp; Larry R. Cassett

[57] ABSTRACT

A multifilamentary stabilized superconductor of the A-15 type is disclosed wherein the A-15 compound is formed on rods of niobium or vanadium by diffusion of tin or gallium, respectively, from a copper alloy matrix and wherein stabilization is provided by an external layer of copper. The stabilizing copper is protected from tin or gallium diffusion by a number of spirally wrapped layers of tantalum separated from one another by copper layers.

3 Claims, 4 Drawing Figures

WRAPPED TANTALUM DIFFUSION BARRIER

CROSS REFERENCE TO RELATED APPLICATION

This application is a continuation-in-part of our application Ser. No. 920,616, filed June 29, 1978, now abandoned.

FIELD OF THE INVENTION

This invention relates to the field of stabilized superconductors; more particularly, it relates to the field of multifilamentary superconductors of the Nb$_3$Sn or V$_3$Ga type wherein the superconductor compound is formed by diffusion of Sn or Ga, respectively, from a Cu and Sn or Ga bronze alloy matrix. The invention relates to an improvement in the diffusion barrier used to separate the stabilizing Cu from the bronze of the matrix.

BACKGROUND OF THE INVENTION

It has been known in the art of superconductors for some years that intermetallic compounds of the A-15 type, perhaps most notably Nb$_3$Sn and V$_3$Ga, have superconductive properties which are very useful in the production of high magnetic fields, in superconductive motors and generators, and in other devices of this type. However, these compounds are metastable which fact prevents them from being made by ordinary chemical processes, and, once made, they are extremely brittle, which does not permit them to be handled or mechanically formed to any great extent. Furthermore, it is well known in the art that superconductors of a given type have more useful properties when they are disposed in the form of continuous filaments extending from one end of the superconductor to another; preferably the filaments are on the order of 2 microns in diameter. Since it is well-nigh impossible to form such filaments individually, it has become the practice of the art to form such fine filaments by reducing a matrix containing a number of rods of the desired compound or of a precursor of the desired compound from a comparatively large billet down to a very fine wire size; the rods are proportionately reduced. It is possible to further reduce the size of the filaments and increase their number by stopping the reduction process at an intermediate stage, cutting the worked composite into lengths, stacking these lengths in an extrusion billet, extruding this to a long rod and further drawing this rod down to wire. This process is used in the manufacture of superconductors of several types, both those of the A-15 type and those of the alloy type, such as NbTi superconductors, which are usually made in a Cu matrix. The A-15 conductors have been most profitably made in the past by employment of the so-called bronze process in which rods of Nb, for example, are embedded in a matrix consisting of Cu and up to about 14% Sn. This composite can be worked, although annealing is necessary from time to time as the bronze work hardens, to a fine wire size. At a desired final size, the composite is heat treated, typically for 50 hours at 700°C., at which time the Sn from the bronze diffuses onto the interfaces between the Nb rods and the matrix and Nb$_3$Sn is formed. This process is disclosed, for example, in U.S. Pat. No. 3,728,165.

It is well known in the art that, despite considerable improvements in manufacturing and in scientific understanding of the principles of superconductors, from time to time the superconductive property will break down. Ordinarily, this is due to an exceeding of any one of several critical parameters which are different for each superconductor: the critical temperature $T_C$, the critical magnetic field $H_C$ and the critical current $J_C$. Most commonly, perhaps, the critical field is exceeded causing the superconductive property in some of the filaments to be lost; the filaments are said to "go normal". This causes the current, of course, in the other filaments to be increased which may result in an exceeding of their critical current with possibly catastrophic results. Therefore, it is well known that a quantity of a suitable electrical conductor must be provided in parallel with the superconductor so that should some of the superconductor filaments "go noraml" an alternative current path or shunt is provided, thus providing a time during which the superconductive property can be restored. Since this phenomenon of going normal is ordinarily local, it is not sufficient to provide a shunt of a good electrical conductor external to the wire as then the heat generated in the normal conductor would be very great. Rather, it is better to provide the normally conductive material in close proximity to the wire to the superconductive wire and, in fact, it is generally accepted that the best way is to provide the wire itself with a quantity of highly electrically conductive material as part of its structure. Thus, wires have been made, typically with a central core of Nb rods having Nb$_3$Sn on their surfaces all embedded in a bronze matrix, and having an external layer of stabilizing high conductivity copper on their outer surface. See for example U.S. Pat. No. 3,728,165. It is desirable that the copper be on the outer surface of the wire rather than within it because the superconductive wires, operating as they do in a very low temperature environment, are usually bathed in liquid helium, so as to bring the temperature of the wire down to a point where the superconductive property is observed. Since the superconductor itself has no electrical resistance, under normal conditions no heat will be generated by the wire. However, if any fraction of the superconductive filaments go normal and current must therefore be carried in the normally conductive material, heat will, of course, be generated due to Joule heating. If the normally conductive material is on the outside of the conductor and this is in a bath of liquid helium at approximately 4.2 K, any heat generated in the normally conductive material can readily be carried off by the liquid helium.

One difficulty which has been faced and partially solved in the prior art is that during heat treatment the Sn or Ga from the bronze matrix tends to diffuse not only onto Nb to form Nb$_3$Sn but outwards into the Cu in order to alloy the Cu into a bronze. This effect, even when of minor quantitative extent, reduces the electrical conductivity of the Cu to such a degree that it is not suitable for its intended purpose. Therefore, some means must be found to protect this Cu from the diffusion of Sn or Ga. The most common method used in the prior art has been to interpose a layer of Ta barrier material, which is impermeable to Sn, between the matrix and the Cu stabilizer. See British Pat. No. 1,394,724. Other methods have been tried: for example layers of Nb have been used; refinements of this method include adding other elements to the Nb so that Nb$_3$Sn does not form on this layer thus making it too a superconductor, as disclosed, for example in British Pat. No. 1,499,507.

However, these methods are troublesome and in most cases complicated and expensive.

While this method of interposing a Ta barrier between the bronze matrix and the Sn stabilizer is of great utility and has been generally accepted by the manufacturers of superconductors, it is not an easy or inexpensive method to practise due to various qualities of the Ta itself, so that the art has felt a need for improvement in this method.

The difficulties caused by the use of Ta as a diffusion barrier are several. For example, Ta is not a common material and is not readily available in the forms that are desired by the manufacturer of superconductors. It would be best from an economic standpoint to make a stabilized superconductor by first providing an extrusion billet of bronze having Nb rods disposed therein, and extruding this to a long, comparatively thin rod, preparatory to drawing the conductor down to its final size. Ideally, the tantalum barrier would be applied in tube form at some intermediate size and this assembly inserted into a Cu tube, so that the Ta would not have to be extruded. However, Ta is not commonly available as tubing, due to the fact that it is very refractory and hard to work; this results in a limited selection of standard sizes of tubing being available. It has turned out in practice that the Ta barrier layer ordinarily must be added to the matrix before extrusion. For purposes of illustration it can be noted here that the typical extrusion billet for a large quantity of superconductor will be on the order of 200 mm in diameter and 1 m long. After extrusion, such a billet might be 75 mm in diameter and 7.1 m long. Clearly if the stabilizing Cu and Ta could be added after extrusion a great deal more superconductive material could be extruded at once, which would be much more efficient. However, Ta not being available as tubes suitable to fit over an as-extruded rod means that tubing must be manufactured to the size of the billet. This is because tubing can be manufactured in nonstandard sizes only by spinning it, using conventional spinning processes, from the flat. However, spinning is limited in that a long tube cannot be formed since a machine tool must penetrate and work on the inside of the tube as well as on the outside. Clearly, a tube 7 m long by 75 mm in diameter simply cannot be made by spinning; however, one 1 m by 200 mm in diameter can be, and it is for this reason that the Ta barrier layer has been in the past generally applied prior to extrusion.

The suggestion has also been made that it would be possible to make Ta tube of any given length and diameter by simply forming a strip of suitable width and length into a tube and welding up the seam. However, as is frequently the case with pure metals, the welding process tends to result in a very large grain size in the area of the welded joint. Tantalum being hard and refractory, these grains will eventually tend to deform unevenly under working; that is, they will tend to deform along the preferential slip planes of the various large grains, resulting in a crack at or near the weld. This means that when the final conductor is heat treated to form Nb$_3$Sn from the Nb rods in the bronze, the Sn will diffuse through the crack in the Ta tube and diffuse into the Cu, thus lowering its electrical conductivity and rendering it more or less useless as a stabilizing material. Hence, the welding method has not been employed.

A further difficulty with the use of Ta as a barrier layer is that it is, as mentioned above, a very hard and refractory material, and as it is worked, it work hardens to a considerable extent, as does the bronze of the matrix. However, while the bronze of the matrix can be annealed relatively easily and at a comparatively low temperature, tantalum can only be annealed at such high temperatures that the bronze of the matrix would actually melt. Hence the tantalum as it is worked simply gets harder and harder and eventually inevitably cracks, again allowing the tin to diffuse into the stabilizing copper and destroying its effectiveness as a stabilizing material. Clearly if the Ta can be added after extrusion, that fraction of the work-hardening is avoided.

A final difficulty with Ta is that it does not bond metallurgically to itself. This prevents a homogenous layer from being formed by simply wrapping a Ta sheet around the extruded rod; this in turn results in uneven stress concentrations in the area of any overlap during drawing; cracking is again the eventual result.

OBJECTS OF THE INVENTION

It is therefore an object of the invention to provide a method for manufacturing a stabilized superconductor of the Nb$_3$Sn type wherein a quantity of stabilizng Cu is protected from diffusion of Sn by a barrier of Ta which retains its integrity throughout the process of the manufacture of the conductor.

It is a further object of the invention to provide an improved way of providing a Ta barrier layer between a bronze matrix and a layer of Cu stabilizing material.

Finally, it is an object of the invention to provide an improved and less expensive method of making a stabilized superconductive of the A-15 type.

SUMMARY OF THE INVENTION

The present invention satisfies the objectives and needs of the art as outlined above by its provision of a spirally wrapped tantalum diffusion barrier. At an intermediate stage in the manufacturing process, after extrusion, a long length of tantalum strip equal in length to the length of the superconductor at a given stage in its processing is wrapped, with substantial overlap, around the conductor. Preferentially this wrapping is done lengthwise. The overlapped layers of tantalum are separated from one another by interleaved Cu layers. In this way, the tantalum is at no point in contact with other tantalum, so that it is required only to bond with copper and not to itself. Furthermore, by providing more than one layer of tantalum with substantial overlap, the Sn is prevented from diffusing into the Cu stabilizer. While theoretically it would be possible for the Sn to diffuse along the spiral path of the interleaved Cu between the overlapped portions of the tantalum barrier and out into the stabilizing Cu, the path in fact is so long that very little if any Sn actually reaches the stablizing copper. Thus, the deficiencies of the use of tantalum as discussed above are avoided. The integrity of the tantalum wrap is preserved because there are no local discontinuities or concentrating of stress which would tend to lead to cracking.

BRIEF DESCRIPTION OF THE DRAWINGS

The invention will be better understood by referring to the drawings in which.

DESCRIPTION OF THE PREFERRED EMBODIMENTS

Figure 1:
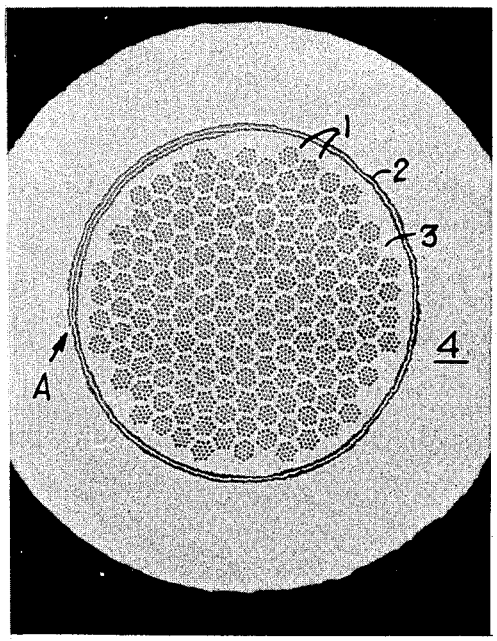
FIG. 1 is a microphotograph at moderate magnification of a conductor manufactured in accordance with the invention.

As described above, the usual configuration for superconductors of the $Nb_3Sn$ type is to have a bronze matrix having Nb rods embedded therein separated from a protective copper stabilizing material on the outside of the conductor by a tantalum barrier layer. FIG. 1 is a microphotograph at 50x magnification, showing such a conductor with a barrier layer manufactured in accordance with the process of the invention. In FIG. 1, reference numeral 1 refers to groups of Nb filaments, 2 shows the barrier layer, 3 the bronze matrix and 4 the copper stabilizer. It will be observed that the tantalum barrier layer 2 goes around the entire matrix roughly 2¼ times; the material separating the two tantalum layers from each other is a thin sheet of copper. It will be obsered that at point A on the left side of FIG. 1 the center tantalum layer has parted, due, presumably, to localized stresses produced by the outer end of the Ta layer 2. However, it will also be observed that the inner tantalum layer has retained its integrity, thus preventing tin from diffusing from the bronze matrix 3 into the copper stabilizing 4. The only path whereby Sn could diffuse into the stabilizer 4 must start at the top of the figure and go between the first and second layers of tantalum until it reaches point A, where it could presumably diffuse into the copper. However, this path is so long and so narrow compared to the total area of the conductor that it is highly unlikely that an appreciable amount of Sn will be diffused into the stabilizing copper 4. Thus the tantalum barrier layer retains its effectiveness despite the fact of the break shown at A. Such a layer as shown in FIG. 1, possibly with a small but not critical break, will be described in the claims appended hereto as an "essentially complete" or "nominally complete" layer.

Figure 2:
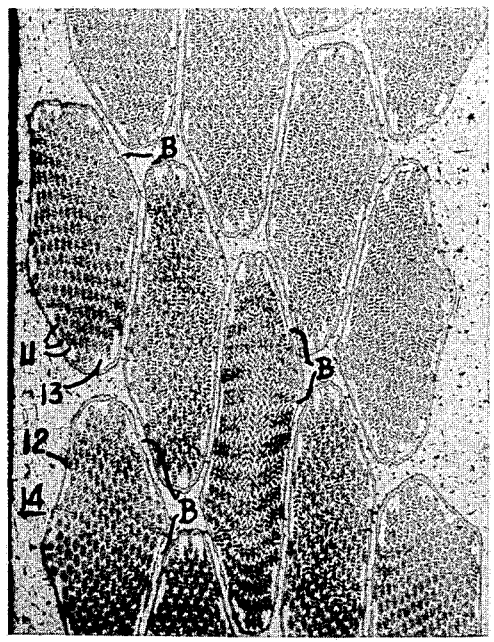
FIG. 2 shows a conductor of the prior art showing deficiencies which are overcome by the present invention.

In comparison, prior art conductors similar to FIG. 1 are shown in FIG. 2, (at 55 x) in which a quantity of conductors similar to that shown in FIG. 1 have been put into an extrusion billet and extruded and worked to a final size. It will be observed that there are a number of groups of Nb filaments 11 in bronze matrices 13 separated from a Cu stabilizer 14 by tantalum barrier layers 12. However, it will also be observed that said barrier layers 12 are broken at many points indicated typically at B. Thus, the tin in the bronze 13 has many short paths through which to diffuse into the Cu, thus destroying its effectiveness as an electrical stabilizing material. The improvement made by the process of the invention is clearly apparent, considering the number of breaks in the tantalum shown in FIG. 2, and the fact that the Ta layer is the only barrier to diffusion of Sn; whereas in the conductor of FIG. 1 not only does a break have to occur but the Sn must still travel a long and narrow path in order to diffuse from the bronze into the Cu.

Figure 3:
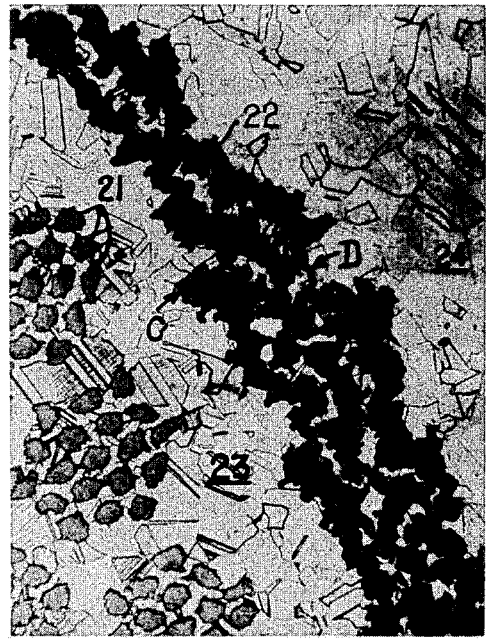
FIGS. 3 and 4 show larger magnifications of barrier layers made according to the process of the invention.
Figure 4:
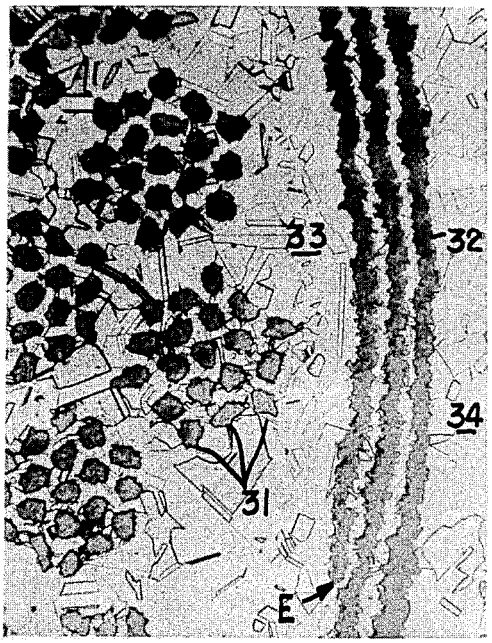

FIGS. 3 and 4 are microphotographs, at 400 x magnification, of barrier layers formed in accordance with the process of the invention. The relative difference in the roughness of the layers is due to differences in the manufacture of the tantalum of which the barriers were made, which will be explained in further detail below. In FIG. 3 the Nb filaments 21 are shown in a bronze matrix 23 separated from a Cu stabilizer 24 by several layers of tantalum 22. The innermost end of the tantalum layer, at C, has apparently caused considerable stress in the barrier layer, as it can be observed at D that the outermost layer has become very thin due to partial separation of the tantalum layer. However, it will also be observed that the layer at D is still continuous and as yet the integrity of the layer has not been broken. A similar photograph also at 400 power magnification is shown as FIG. 4. There, Nb filaments 31, in a bronze matrix 33 and separated from a copper stabilizer 34 by tantalum barrier layers 32, just as in FIG. 3, are shown. Here, however, the tantalum layers are much smoother due, as mentioned above, to differences in processing methods. Here the end E has not apparently caused concentration of stress on the outer two layers, inasmuch as they are quite uniform in the vicinity of the end E.

The differences in processing which, as referred to above, explain the difference in appearance between the barrier layers 22 of FIG. 3 and 32 of FIG. 4 are as follows. The tantalum foil used to make the barrier layers in FIG. 3 was made in the conventional methd of rolling a cast tantalum ingot to a fine foil, in this case approximately 0.25 mm thick when applied, while that in FIG. 4 was made by conventional powder metallurgy techniques. It is theorized that the difference in appearance is due to the fact that the grain size in the barrier layers 22 of FIG. 3 is far larger than that in the barrier layers 32 shown in FIG. 4. This is primarily because the grain size in the as-cast ingot is far larger than the size of the powders used in the powder metallurgical approach. However, it may be possible to reduce the grain size in the foil made by the casting approach by careful control of annealing conditions.

As mentioned above, tantalum does not tend to bond well to itself and it therefore is desirable to avoid contact of one tantalum layer with another; hence the interposition of the Cu layers according to the invention. Furthermore, in this way, the soft Cu forms a cushion for the tantalum so that if the tantalum chooses to deform preferentially in one direction over another, as shown perphaps most clearly in FIG. 3, the Cu still provides a cushion whereby the integrity of the tantalum layers can be retained despite uneven deformation of the tantalum. As is well known in the metallurgical art, metals when stressed tend to deform along preferential planes which are defined by the orientations of the individual crystals in the structure. By observation of FIG. 3 it can be seen how this works out in practice. For example, the break, or near break, at D in FIG. 3 indicates that the crystals above and below D were oriented in such a way that they tended to slip apart, thus stretching the material at D, so that it became quite thin, as shown. It will be clear, therefore, that the smaller grains of tantalum which result from making the foil by powder metallurgical processes as in FIG. 4 are desirable; however, it does not appear, examining FIG. 3, that they are essential. Economics and further tests will presumably dictate which method is used in production; quite possibly the powder metallurgy method will be used for conductors made by multiple extrusion methods (as shown in FIG. 2, for example) while the conventional rolled foils may be adequate for less-worked conductors as exemplified by FIG. 1.

A detailed description of the process of the invention, the results of which are shown in FIG. 1, will now be provided. Originally a bronze billet was prepared, having 19 holes for the insertion of Nb rods. This assembly was extruded and drawn to an intermediate size and hexed. This rod was cut into 151 pieces which were stacked in an extrusion can having an outside diameter of approximately 6 in; the can was about 18 in. long. This was sealed and extruded, which yielded a rod 1¼" (31 mm) in diameter by approximately 29 ft (9 m) long. This was then drawn to 0.668" (17 mm) in diameter. This rod was cleaned and straightened and wrapped with a tantalum foil which was 5" (125 mm) wide and approximately 0.005" (0.125 mm) thick. A copper foil interleaf 4" (100 mm) wide, also 0.005" (0.125 mm) thick was used to separate the several layers of tantalum. The foils were tack (i.e. spot) welded to the rod at one end to hold them in place during assembly, the foils were clamped tightly to the rod and the entire assembly was inserted into an external copper tube of 1¼" (31 mm) O.D. and ¾" (19 mm) I.D. This rod was then drawn in gradual stages until the diameter of the wire was 0.015" (0.375 mm) and its length was approximately 20,000 feet (6600 m). The individual filaments are approximately 2 microns in diameter. This represents a desirable final size for superconductive wire, wires under about 0.015" being very difficult to handle and to draw without breaking; at this point a conventional heat treatment may be performed to form $Nb_3Sn$ on the interfaces of the Nb and the bronze. This conductor is shown in FIG. 1 prior to heat treatment. Alternatively, a quantity of the conductors of FIG. 1 could be combined in a further extrusion and drawing stage as in FIG. 2. This would yield, of course, many more filaments. In such a case, the typical practice would be to stack a number of the rods of FIG. 1 in a second extrusion can and work this composite to a final desired size and heat treat it at that point to form $Nb_3Sn$ on the surface of the Nb filaments.

It will be apparent to those skilled in the art that there are many modifications and changes to the invention which can be made without impairing its essential utility. For example, the invention has been described largely in terms of at least two complete wraps of tantalum around the central core. Obviously a wrap of just over one turn with a suitable interleaving of copper would presumably work as well. However, if the tantalum then broke at an end point as shown in point A of FIG. 1, the Sn would have a comparatively straight path to the stabilizing Cu. Hence, in most applications it will be desirable to use at least two complete wraps, although it will be apparent that by using the powder metallurgical manufactured tantalum better results can be achieved, possibly to the extent that only one layer need be used. In any case it seems to be important that the tantalum layers be separated from one another by Cu so that the tantalum is not forced to bond to itself and so that local stress concentrations at the ends of the wrap can be avoided or at least cushioned by the interleaved copper. Further possible modifications to the invention as described would be the use of a plurality of the composites of FIG. 1 in a structure similar to that of FIG. 2 although, of course, the single and discontinuous tantalum barriers of FIG. 2 will be replaced by the multiple wrap layers of FIG. 1. Another modification could be that the conductor could be of a shape other than round. Any process for manufacturing stabilized superconductors by the so-called bronze process can be improved by the use of tantalum stabilization as described in the claims herein.

However, alternative methods to the bronze process described above are also being developed, and the present invention has utility in these areas as well. One new approach involves replacing the bronze matrix with one having Sn (or an alloy of Sn, and up to 15% Cu) disposed throughout a Cu matrix; several differnet arrangements of the Sn in the Cu have been proposed. See, for example, U.S. Pat. No. 3,905,839. Upon heat treatment, the Sn diffuses throughout the Cu both to form bronze and to form $Nb_3Sn$. The tantalum wrapping of the invenion would be useful in the manufacture of such conductors.

Yet another possibly useful modification is the replacement of the Ta barrier material with another refractory metal; such as alloys of Ta, Hf, Mo, W or some other material. In many of these cases the method of the invention would still be useful, as the barrier material employed would possess the same qualities which make Ta so difficult to work with.

Another possible modificaiton includes the substitution of another metal for the Cu interleaved between the barrier layers. It appears that any metal which is sufficiently soft and which would not have a deleterious reaction with the matrix or stabilizing metal could be used; Ag, Au, Pt, Nb, Ni, and Cu-Ni alloy are possibilities. Similarly, any high conductivity metal could be used as the stabilizing material in place of Cu; Ag, Au and Al are all possibilities.

Therefore, it should be apparent that the examples and description given above are intended to be illustrative only and that the invention is more properly described in the following claims.

We claim:

1. A stabilized multifilamentary superconductor wherein the superconductive material is of the type $A_3B$, is selected from the group consisting of $Nb_3Sn$ and $V_3Ga$, and is formed by diffusion of the B mateial from a matrix of an alloy of Cu and the B material onto the surfaces of wires or filaments of the A material embedded therein, and wherein the improvement comprises providing a quantity of a stabilizing metal on the external surface of the conductor selected from the group consisting of Ag, Au, Al and Cu and isolating this stabilizing metal from diffusion of the B material by providing a wrapped diffusion barrier consisting of at least one essentially complete layer, having substantial layer overflap, of a refractory metal foil impermeable to tin between the central matrix and the stabilizing metal, the overlapping portions of said layer being separated from one another by an interleaved foil of a metal softer than the refractory metal.

2. A stabilized multifilamentary superconductor, comprising: a central matrix consisting essentially of a plurality of Nb rods in a Cu/Sn matrix, $Nb_3Sn$ having been formed at the interface of the matrix and the Nb rods;

a quantity of stabilizing Cu on the external surface of the conductor; and a barrier interposed between the matrix and the stabilizing Cu, the barrier comprising at least two nominally complete layers of a refractory metal foil, said layers having been formed by wrapping a continuous length of said foil around the matrix, and said layers being separated from one another by interleaved Cu foil.

3. The superconductor according to claims 1 or 2 wherein the refractory metal foil is formed by powder metallurgical processes.

* * * * *

UNITED STATES PATENT AND TRADEMARK OFFICE
CERTIFICATE OF CORRECTION

PATENT NO. : 4,205,119
DATED : May 27, 1980
INVENTOR(S) : Morris S. Young and David C. Larbalestier It is certified that error appears in the above-identified patent and that said Letters Patent are hereby corrected as shown below:

Col. 2, line 15, "' go noraml'" should read -- " go normal --.

Col. 4, line 31, "superconductive" should read -- superconductor --.

Col. 5, line 20, "obsered" should read -- observed --.

Col. 8, line 3, "differnet" should read -- different --, line 17, "modificaiton" should read -- modification --, line 34, "mateial" should read -- material --, line 44, "overflap" should read -- overlap --.

Signed and Sealed this

Eighteenth Day of November 1980

[SEAL]

Attest:

SIDNEY A. DIAMOND

Attesting Officer

Commissioner of Patents and Trademarks